(12) United States Patent
Jacquin et al.

(10) Patent No.: US 6,900,150 B2
(45) Date of Patent: May 31, 2005

(54) CERAMIC COMPOSITION AND METHOD

(75) Inventors: Jeffrey R. Jacquin, Albuquerque, NM (US); Randy E. Rose, Rio Rancho, NM (US)

(73) Assignee: CTS Corporation, Elkhart, IN (US)

( * ) Notice: Subject to any disclaimer, the term of this patent is extended or adjusted under 35 U.S.C. 154(b) by 0 days.

(21) Appl. No.: 10/425,161

(22) Filed: Apr. 29, 2003

(65) Prior Publication Data

US 2004/0220044 A1 Nov. 4, 2004

(51) Int. Cl.[7] .............................................. C04B 35/468
(52) U.S. Cl. ..................................... 501/139; 333/219.1
(58) Field of Search ........................ 501/139; 333/219.1

(56) References Cited

U.S. PATENT DOCUMENTS

| | | | |
|---|---|---|---|
| 4,992,398 A | 2/1991 | Huang et al. | |
| 5,019,306 A | 5/1991 | Huang et al. | |
| 5,256,639 A | 10/1993 | Fujimaru et al. | |
| 5,449,652 A | 9/1995 | Swartz et al. | |
| 5,493,262 A | 2/1996 | Yano et al. | |
| 5,504,044 A | 4/1996 | Okawa et al. | |
| 5,532,197 A | 7/1996 | Kim et al. | |
| 5,767,030 A | 6/1998 | Kim et al. | |
| 5,821,181 A | 10/1998 | Bethke et al. | |
| 5,840,642 A | 11/1998 | Kim et al. | |
| 6,087,286 A | 7/2000 | Ikeda et al. | |
| 6,107,227 A | 8/2000 | Jacquin et al. | |
| 6,133,175 A | 10/2000 | Bethke et al. | |
| 6,184,165 B1 * | 2/2001 | Kawata ....................... | 501/32 |
| 6,225,250 B1 | 5/2001 | Wada et al. | |
| 6,242,376 B1 | 6/2001 | Jacquin et al. | |
| 6,274,526 B1 | 8/2001 | Kawano et al. | |
| 6,316,374 B1 | 11/2001 | Kawakami | |
| 6,319,871 B1 * | 11/2001 | Sato et al. ................... | 501/139 |
| 6,331,499 B1 | 12/2001 | Shimada et al. | |
| 6,335,301 B1 | 1/2002 | Kikuchi et al. | |
| 6,380,117 B2 * | 4/2002 | Sato et al. ................... | 501/139 |
| 6,403,512 B1 | 6/2002 | Ishikawa et al. ............. | 501/136 |
| 6,429,164 B1 * | 8/2002 | Wada et al. ................. | 501/139 |
| 6,559,083 B2 | 5/2003 | Jacquin et al. | |
| 6,613,705 B1 * | 9/2003 | Feltz et al. .................... | 501/32 |
| 6,740,614 B2 * | 5/2004 | Kim et al. ................... | 501/139 |

FOREIGN PATENT DOCUMENTS

| | | |
|---|---|---|
| EP | 1 043 288 | 10/2000 |
| JP | 57 156367 | 9/1982 |
| JP | 3-5364 * | 1/1991 |
| JP | 6107457 | 4/1994 |
| JP | 9208304 | 8/1997 |

OTHER PUBLICATIONS

Cheng–Liang Huang, Dielectric Properties of CaTiO3–Ca(Mg1/3Nb2/3)O3 Ceramic System at Microwave Frequency, Jpn. J. Appl. Phys. vol. 39 (Dec. 2000) pp. 6608–6611, Japan.

* cited by examiner

*Primary Examiner*—Karl Group
(74) *Attorney, Agent, or Firm*—Daniel J. Deneufbourg; Robert J. Ross

(57) ABSTRACT

A ceramic material suitable for use as a microwave band filter for telecommunications equipment comprises oxides of titanium, barium, neodymium, samarium, and optionally, bismuth, and containing, on an elemental weight basis: about 28 to about 31 weight % titanium, about 19 to about 21 weight % barium, about 11 to about 18 weight % samarium, about 7 to about 13 weight % neodymium, up to about 3 weight % of bismuth, and the remainder substantially being oxygen. The ceramic compositions have a resonant frequency, f, in the range of about 2000 MHz to about 2300 MHz, a quality factor, Q, of at least about 4000, a dielectric constant, K, in the range of about 50 to about 70, and a temperature coefficient of resonant frequency, $T_f$, in the range of about 0 ppm to about +20 ppm. Calcined metal oxide powders useful for preparing the microwave ceramic materials, a method of making the ceramic materials, and devices containing the ceramic materials are also described.

25 Claims, 2 Drawing Sheets

CERAMIC COMPOSITION AND METHOD

TECHNICAL FIELD

This invention relates generally to ceramic materials, and particularly to barium neodymium samarium titanate ceramic-materials suitable for microwave filter applications. This invention also relates to methods of manufacturing barium neodymium samarium titanate ceramic materials suitable for microwave filter applications.

BACKGROUND

Ceramic materials suitable for use as microwave filters for a specified application are selected based upon a number of physical and electrical properties of the ceramic materials. Among the most important properties for selecting a ceramic material for use in a specified microwave communication or radar device are: dielectric constant, K (also known as relative permittivity, $\in_r$), the quality factor, Q, the resonant frequency, f, and the temperature coefficient of resonant frequency, $T_f$.

The dielectric constant, K, of a material relates to the capacitance of the material (the ability to store electrical energy). The dielectric constant of a material, at least in part, determines the size of the filter necessary for a given application. Filter size is inversely related to the dielectric constant of the filter material. Relatively small filters can be fashioned from relatively high dielectric constant materials, whereas filter size must be increased as the dielectric constant is decreased. While very high dielectric constant materials may be considered desirable for miniaturization of equipment, practical considerations of design, as well as other physical properties of the ceramic filter material, such as the Q value and temperature coefficient of resonant frequency, will often dictate a choice of a relatively low dielectric constant material. Ceramic materials having a dielectric constant, K, in the range of about 30 to about 100 are particularly useful in wireless telecommunications applications.

The quality factor, Q, is a measure of the efficiency of a microwave system, which relates to the degree of power loss of the system. A quality factor can be defined for a whole system, a device, or for specific components or groups of components within a device or system. As used herein and in the appended claims, the Q value refers to a quality factor for a ceramic material in the form of a disc having a diameter of about 1.33 inches and a height of about 0.5 inches. Q is a dimensionless factor equal to $1/(\tan \delta)$, where $\delta$ is the loss angle. In an ideal capacitor, the phase of the alternating current will lead the phase of the voltage by 90 degrees, whereas in all real capacitors, a power loss occurs, which is manifested in a phase deviation from the ideal 90 degrees. The difference between ideal phase angle (90 degrees) and the measured phase angle in an actual capacitor is equal to $\delta$. As $\delta$ decreases, $1/(\tan \delta)$ increases, therefore, higher values of Q represent smaller values of $\delta$, and thus indicate higher power efficiency for a capacitor.

Experimentally, Q can be determined by the shape of the frequency resonance peak in a graph of frequency versus signal amplitude. Typically, there is a peak in transmitted signal amplitude at the resonant frequency, and the distribution of amplitude versus frequency has a finite width. By convention, the "bandwidth" is defined as the width of the frequency distribution at one-half of the maximum amplitude. The peak frequency (resonant frequency, f) divided by the bandwidth is equal to Q. Thus high Q values indicate narrow bandwidths.

The resonant frequency, f, is the peak frequency of the microwave energy that is transmitted (i.e., not blocked) by the filter. Because power losses generally increase with increasing frequency, the Q value is dependent on the resonant frequency of the filter, and the value of Q is properly reported in combination with the resonant frequency (often the frequency is listed in parentheses after Q). For convenience, a factor which is the product of Q multiplied by the resonant frequency in GHz (hereinafter "frequency*quality factor" or $Q_f$, in units of GHz) is often utilized in place of, or in addition to reporting the Q and frequency.

For many ceramic filter materials, f will vary with the temperature of the filter. The temperature coefficient of resonant frequency, $T_f$, represents the change in f per degree C increase in temperature, reported in parts per million (ppm), i.e., the number of Hz by which the frequency changes when the temperature is changed one degree C, divided by f in MHz. It is particularly desirable for $T_f$ to be as close to zero as possible; however, in practice, a $T_f$ in the range of about −20 to about +20 ppm is acceptable.

A number of types of ceramic materials have been utilized as microwave filters in the telecommunications industry. Many microwave dielectric materials can be classified as perovskites, which have the general structure $ABO_3$, where the weighted sum of the oxidation states of metal ions A and B is equal to +6. Various complex perovskites, such as certain tantalates (e.g., barium magnesium tantalate, $Ba(Mg_{1/3}Ta_{2/3})O_3$ and barium zinc tantalate, $Ba(Zn_{1/3}Ta_{2/3})O_3$), have been utilized in applications requiring very high Q values (i.e., >100,000). Such complex tantalates tend to have relatively low dielectric constants of less than about 30.

Another commonly used group of perovskite materials are the titanates, such as barium titanate ($BaTiO_3$) and various mixed-metal titanates, such as calcium magnesium titanate and zirconium tin titanate, having varying ratios of calcium:magnesium and zirconium:tin, respectively, and the like. Other important classes of titanates include the barium neodymium titanates and the barium neodymium samarium titanates.

Microwave dielectric materials also can be multiphase materials such as barium neodymium titanates combined with an excess of titanium dioxide, for example. These materials can have high dielectric constants (e.g., 90 or greater), with Q values in the range of about 5,000 to 6,000, particularly when dopants such as lead oxides and bismuth oxide are utilized.

A major challenge in modern microwave dielectric ceramic filter materials research is the development of near zero $T_f$ materials. The achievement of relatively low $T_f$ in filter materials having a dielectric constant in the mid-dielectric constant range of about 50–70 has been a particular challenge. Filters made from materials with relatively lower K values typically are too large, whereas filters made from materials having relatively higher K values generally sacrifice performance in Wide-Band Code Division Multiple Access (WCDMA) and Personal Communications Service (PCS) digital wireless communications applications where relatively small dimension filters are particularly important.

Thus, there is an ongoing need for ceramic microwave filter materials having a relatively low $T_f$, in the range of about ±20 ppm, a Q of at least about 4000, and K in the range of about 50 to about 70.

SUMMARY

A ceramic material of the present invention is a multiphase ceramic comprising titanium, barium, neodymium, samarium and optionally, bismuth in the form of metal oxides. The ceramic material comprises, on an elemental weight basis, about 28 to about 31 weight % titanium, about 19 to about 21 weight % barium, about 11 to about 18 weight % samarium, about 7 to about 13 weight % neodymium, and up to about 3 weight % of bismuth, each metal being present in the form of an oxide. The ceramic material of the present invention is useful for the manufacture of microwave filters for telecommunication systems and devices.

The ceramic materials of the present invention can be classified as barium neodymium samarium titanates comprising titanate and titanium dioxide phases. The ceramic materials of the present invention typically have a temperature coefficient of resonant frequency, $T_f$, in the range of about 0 ppm to about +20 ppm, a resonant frequency, f, in the range of about 2000 to about 2300 MHz, a Q value of at least about 4000, and a dielectric constant, K, in the range of about 50 to about 70. The ceramic materials of the present invention are particularly useful as microwave filters for WCDMA and PCS telecommunications equipment.

In one preferred embodiment, the ceramic material is doped with bismuth oxide in an amount sufficient to provide at least about 1 weight % of bismuth in the ceramic material, on elemental weight basis. Preferably, the ceramic material comprises at least about 14 weight % samarium, and not more than about 9 weight % neodymium, on an elemental weight basis.

Another aspect of the present invention is a calcined powder comprising, on an elemental weight basis, about 28 to about 31 weight % titanium, about 19 to about 21 weight % barium, about 11 to about 18 weight % samarium, about 7 to about 13 weight % neodymium, and up to about 3 weight % of bismuth. The titanium, barium, neodymium, samarium and bismuth are present in the powder in the form of oxides. In one preferred embodiment the calcined powder comprises at least about 1 weight percent bismuth, on an elemental weight basis. In another preferred embodiment, the calcined powder comprises at least about 14 weight % samarium, and not more than about 9 weight % neodymium, on an elemental weight basis.

In another aspect, the present invention provides a method of manufacturing a multiphase barium neodymium samarium titanate ceramic material having a $T_f$ in the range of about 0 ppm to about +20 ppm, a f in the range of about 2000 to about 2300 MHz, a Q value of at least about 4000, and a K in the range of about 50 to about 70.

The method comprises the steps of: calcining a finely divided, substantially homogeneous mixture comprising, on a total mixture weight basis, about 26 to about 28 weight % $BaCO_3$, about 47 to about 50 weight % $TiO_2$, about 12 to about 20 weight % $Sm_2O_3$, about 8 to about 14 weight % $Nd_2O_3$, and up to about 3 weight % $Bi_2O_3$. The calcining is effected at a temperature in the range of about 1000 to about 1250 EC for a time in the range of about two to about six hours. The resultant calcined mixture has a mean particle size in the range of about 5 to about 15 micrometers, as determined by a Horiba Model LA9000 laser particle size analyzer.

The mixture of calcined powder can be comminuted, for example, by wet grinding the powder in a ball mill, or by any other expedient method for achieving the desired particle size distribution. Grinding media useful for wet grinding the calcined material include alumina and zirconia grinding media. Preferably a zirconia grinding medium is used, more preferably a magnesium oxide or yttrium oxide stabilized zirconium oxide grinding medium, most preferably a magnesium oxide stabilized zirconium oxide grinding medium. The resultant comminuted mixture has a mean particle size in the range of about 1.5 to about 3 micrometers, as determined by a Horiba Model LA9000 laser particle size analyzer.

A green body is typically formed by applying pressure to a milled mixture of metal oxides as described above, in a mold or die. The pressure results in the formation of a friable solid object. Binders such as polyvinyl alcohol (PVA), and plasticizers such as polyethylene glycol (PEG), for example, can be added to the milled mixture to improve the binding and formability of the green body.

The green body is then sintered at a temperature in the range of about 1300 to about 1500 EC, for a time period in the range of about three to about five hours to form a ceramic material. The ceramic material is then cooled in the sintering furnace to a temperature at which it can be safely removed from the furnace without subjecting the ceramic to thermal shock (generally about 50 EC or lower).

Yet another aspect of the present invention is a telecommunication device comprising a ceramic dielectric microwave filter having a $T_f$ in the range of about 0 ppm to about +20 ppm, a f in the range of about 2000 to about 2300 MHz, a Q of at least about 4000, and a K in the range of about 50 to about 70. The ceramic material is composed of metal oxides and comprises, on an elemental weight basis, about 28 to about 31 weight % titanium, about 19 to about 21 weight % barium, about 11 to about 18 weight % samarium, about 7 to about 13 weight % neodymium, up to about 3 weight % of bismuth, and the remainder substantially being oxygen.

DETAILED DESCRIPTION OF PREFERRED EMBODIMENTS

Figure 1:
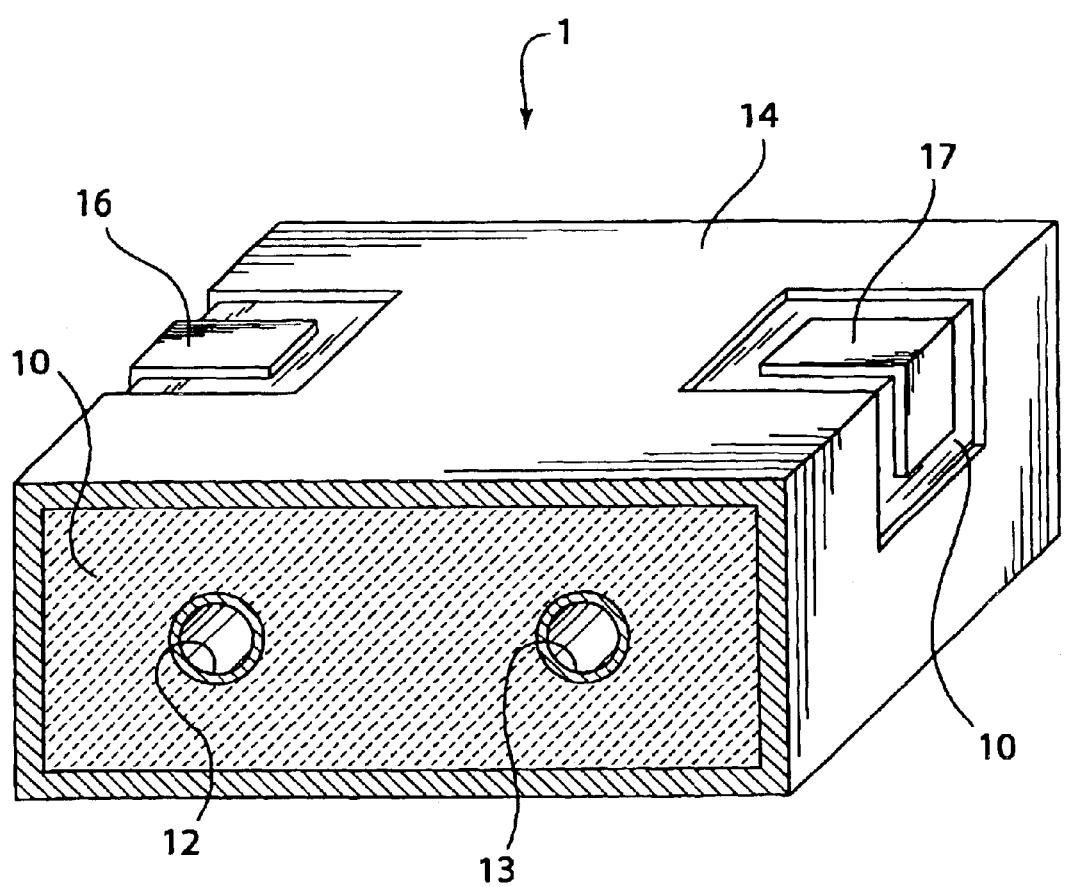
FIG. 1 depicts a ceramic microwave filter of the present invention.

As used herein and in the appended claims, the terms "calcine," "calcining," "calcination" and grammatical variations thereof, refer to a process of heating a particulate substance below its fusion or melting point to effect a chemical change in one or more component of the material, such as to drive off carbon dioxide from a metal carbonate to form a metal oxide. Generally, calcining also leads to a reduction in the number of material phases in a mixed-metal oxide composition. For example, a powdered mixture of titanium oxide, barium carbonate and neodymium oxide initially contains three distinct phases, one for each individual compound in the mixture. During calcination carbon dioxide is driven off of metal carbonates such as barium carbonate to form oxides such as barium oxide. In addition, initially separate metal oxide phases such as titanium dioxide, neodymium oxide, samarium oxide, and barium oxide, will typically merge together into one or more complex, mixed-metal oxide phase. The terms "calcinated powder" and "calcinated particulate material" as used herein and in the appended claims refer to a powder or particulate material that has been subjected to a calcination process.

The term "sintering" and grammatical variations thereof, as used herein and in the appended claims, refers to a process of heating a molded object composed of a calcined, particulate material comprising metal oxides, or other inorganic compounds (i.e., a "green body"), typically at a temperature below the melting point of the material, and for a time period sufficient to form a coherent, fused, solid mass (i.e., a ceramic material). Sintering (alternatively referred to as "firing") is accompanied by an increase in density and a concomitant decrease in size relative to the density and size of the green body.

A green body is typically formed by applying pressure to a calcined mixture of metal oxides as described above, in a mold or die. The pressure results in the formation of a friable solid object. Binders such as polyvinyl alcohol (PVA), and plasticizers such as polyethylene glycol (PEG), for example, can be added to the calcined mixture to improve the binding and formability of the green body. The sintering process converts the friable green body into a relatively hard, ceramic material, and any organic materials, such as binder and plasticizer, are typically burned off during the sintering process. In many cases, the green body is held at a temperature of at least about 500 EC to burn off the organic materials before bringing the material to the sintering temperature (generally at least about 1300 EC).

As used herein and in the appended claims, the term "substantially homogeneous" when used in reference to mixtures of powdered metal oxides and metal salts, means that the powders have a similar particle size distribution and have been mixed together in such a way that, on a macroscopic scale, compositional analyses of random samples of the mixture will result in substantially the same compositional result, which is equivalent to the average composition of all of the metal oxide and metal salt components in the mixture, in proportion to their amounts in the mixture.

The term "mesh" as used herein and in the appended claims refers to a maximum particle size based on material that will pass through an American Standard Sieve Series sieve of the specified mesh size. For example, a powdered material having particle size of 40 mesh means that the powder will pass substantially completely through an American Standard Sieve rated as 40 mesh (i.e., having a sieve opening of about 0.42 millimeters (420 micrometers).

A ceramic material of the present invention has a chemical composition, on an elemental weight basis, of about 28 to about 31 weight % titanium, about 19 to about 21 weight % barium, about 11 to about 18 weight % samarium, about 7 to about 13 weight % neodymium, up to about 3 weight % of bismuth, and the remainder substantially oxygen. Typically the oxygen content is in the range of about 25 to about 27 weight %, on an elemental weight basis. Preferably, the ceramic material comprises at least about 1 weight % bismuth on an elemental weight basis, more preferably, the ceramic material has a bismuth content in the range of about 1 to about 3 weight %. The material preferably comprises at least about 14 weight % samarium, and not more than about 9 weight % neodymium, on an elemental weight basis.

In a particularly preferred embodiment, the ceramic material of the present invention comprises, on an elemental weight basis, about 28 to about 31 weight % titanium, about 17 to about 21 weight % barium, about 14 to about 18 weight % samarium, about 7 to about 9 weight % neodymium, and about 1 to about 3 weight % bismuth. Preferably, the ratio of neodymium to samarium in the ceramic material is in the range of about 1:1 to about 1:2.5, on an elemental weight basis, which corresponds to a range of about 0.95:1 to about 1:2.4 on a molar basis.

Another aspect of the present invention is a calcined powder comprising, on an elemental weight basis, about 28 to about 31 weight % titanium, about 19 to about 21 weight % barium, about 11 to about 18 weight % samarium, about 7 to about 13 weight % neodymium, and up to about 3 weight % of bismuth. In one preferred embodiment the calcined powder comprises at least about 1 weight percent bismuth, on an elemental weight basis. In another preferred embodiment, the calcined powder comprises at least about 14 weight % samarium, and not more than about 9 weight % neodymium, on an elemental weight basis.

Both the calcined powder and the ceramic material of the present invention can be described as having a mixed metal oxide composition comprising at least one metal titanate phase in combination with a titanium dioxide phase. The metals (i.e., Ti, Ba, Nd, Sm, and Bi) are present in oxidized forms, which can include pure metal oxide phases such as a $TiO_2$ phase, and mixed-metal oxide phases such as perovskite phases. In a preferred embodiment, the ceramic material is doped with bismuth oxide (e.g., $Bi_2O_3$).

The metallic elements (i.e., barium, neodymium, samarium, bismuth and titanium) in the ceramic material of the present invention can be present in the form of oxides such as $BaO$, $Nd_2O_3$, $Sm_2O_3$, $Bi_2O_3$, and $TiO_2$, as well as titanates having the general formula $Ba_wNd_xSm_yBi_zTiO_3$, wherein w, x, y, and z each independently have a value in the range of zero to about 1, and $2w+3x+3y+3z=2$. It is understood by those of skill in the ceramic arts that such oxides and titanates generally are not exclusively present in their pure forms, but rather can exist in complex, mixed structures within the crystal lattices of the various phases of the ceramic material.

The elemental composition of a calcined powder or ceramic material of the present invention can be determined by any of a number of analytical methods, which are well known in the ceramic, mineral, and analytical chemistry arts. The composition can be analyzed, for example, by optical emission spectroscopy, atomic absorption spectroscopy (AA), x-ray fluorescence spectroscopy, and the like, after appropriate sample preparation. Exemplary descriptions of these techniques can be found in Willard, Merritt, and Dean, *Instrumental Methods of Analysis*, Fifth Edition, D. Van Nostrand Company, New York (1974), the relevant disclosures of which are incorporated herein by reference. The elemental composition of the ceramic material of the present invention can also be determined by techniques such as inductively-coupled plasma (ICP) spectroscopy, electron microprobe analysis, wet analytical techniques such as gravimetric analysis, and the like, as is well known in the art.

The ceramic materials of the present invention have a number of useful physical and electrical properties, which makes them particularly suitable for use as microwave filter components in WCDMA, PCS, and other microwave telecommunications equipment. The ceramic materials have a f in the range of about 2000 MHz to about 2300 MHz, a Q of at least about 4000, a $Q_f$ of at least about 9000, a K in the range of about 50 to about 70, and a $T_f$, in the range of about 0 ppm to about +20 ppm. In a preferred embodiment, ceramic materials of the present invention doped with bismuth oxide in an amount sufficient to provide at least about 1 weight % of bismuth, and further containing at least about 14 weight % samarium, and not more than about 9 weight % neodymium, on an elemental weight basis, typically have a $T_f$ in the range of about 0 ppm to about +15 ppm.

The ceramic materials of the present invention can be prepared by standard ceramic manufacturing techniques that are well known in the ceramic arts. Such techniques involve preparation of a green body by compressing, in a die or mold, a powdered, calcined mixture of metal oxides, optionally employing a binder, followed by firing (i.e., sintering) the green body at a temperature below the melting point of the calcined material, but at a sufficiently high temperature to cause the material to form a solid ceramic mass. Preferably, the ceramic material of the present invention, after sintering, has a fired-density in the range of about 5 to about 5.3 grams per cubic centimeter.

One preferred method of manufacturing the ceramic materials of the present invention comprises the steps of: calcining a finely divided, substantially homogeneous mixture comprising, on a total mixture weight basis, about 26 to about 28 weight % $BaCO_3$, about 47 to about 50 weight % $TiO_2$, about 12 to about 20 weight % $Sm_2O_3$, preferably at least about 15 weight % $Sm_2O_3$, about 7.5 to about 14 weight % $Nd_2O_3$, preferably not more than about 10 weight % $Nd_2O_3$, and up to about 3.2 weight % $Bi_2O_3$, preferably about 1 to about 3.2 weight % $Bi_2O_3$.

The calcination process is performed at a temperature in the range of about 1000 to about 1250 EC, preferably about 1100 to about 1200 EC, for a time period in the range of about 2 to about 4 hours. Optionally, the calcined material can be comminuted by ball milling to a particle size of 1.5–3.0 microns. A green body is then formed from the calcined material using PVA binder and PEG plasticizer. This body is then sintered in a furnace at a temperature in the range of about 1300 to about 1500 EC, preferably in the range of about 1350 to about 1400 EC, for a time period in the range of about 3 to about 6 hours. The resultant ceramic material is then cooled in the furnace by turning off the heat source. Preferably the ceramic material is cooled to a temperature at which the material can be removed from the furnace without experiencing thermal shock (generally about 50 EC or lower).

Preferably, the substantially homogeneous mixture of barium carbonate, neodymium oxide, samarium oxide, titanium dioxide and bismuth oxide (when present), is prepared by grinding an aqueous slurry of the metal compounds in a ball mill, or similar apparatus. Preferably the slurry contains about 40 to about 60% by weight water. After grinding to the desired particle size distribution, the mixture will be substantially homogeneous. The slurry can also include about 0.5 to about 1 percent by weight of a dispersing agent. Suitable dispersing agents include water soluble polymers such as, a polyacrylic acid, a polymethacrylic acid, an acrylic/methacrylic acid copolymer, an acrylamide/acrylic acid copolymer, or an ammonium salt thereof.

The resulting slurry is then dried by application of heat, vacuum, or both. The drying preferably is accomplished by placing the comminuted slurry in pans in a forced air convection oven, by spray drying, by heating in an indirectly heated cascading plate drier, by heating in a directly heated cascading plate drier, by heating in a vacuum oven, and the like. The mixture preferably is dried at a temperature in the range of about 100 to about 150 EC, more preferably at least about 125 EC. Most preferably the slurry is spray dried. Typically the dried material has a water content of less than about 0.5 percent by weight.

During the calcining step, barium carbonate is substantially converted to barium oxide (BaO) by expulsion of carbon dioxide, and any remaining water in the mixture may be substantially driven off as well. Calcining may also effect changes in the oxidation state of the various metal elements in the mixture depending on whether the atmosphere in the calcining furnace is an oxidizing atmosphere, reducing atmosphere, or is oxidatively neutral. Calcining can also result in some compositional mixing of the various metal oxides within individual particles. Preferably the calcining step is accomplished under an oxidizing atmosphere such as air.

Optionally, the resultant calcined powder can be comminuted, if necessary, to obtain a particle size more preferably in the range more preferably about 1.5 to about 2.5 micrometers, as determined by a Horiba Model LA9000 laser particle size analyzer.

The mixture of metal oxides and/or the calcined powder can be comminuted, for example, by wet grinding the powder in a ball mill as described above, or by any other expedient method for achieving the desired particle size distribution. Grinding media useful for wet grinding the calcined material include alumina and zirconia grinding media. Preferably a zirconia grinding medium is used, more preferably a magnesium oxide or yttrium oxide stabilized zirconium oxide grinding medium, most preferably a magnesium oxide stabilized zirconium oxide grinding medium.

A green body can be fashioned from the calcined powder by applying pressure to the mixture in a die or mold, as is well known in the ceramic arts. An organic binder such as polyvinyl alcohol (PVA), and the like, and/or water, can be added to increase adhesion of the particles and increase the mechanical strength and dimensional integrity of the green body. Surfactants and other additives can be added, if desired, to improve the packing efficiency of the powders in the green body. The binder, plasticizer, and surfactants, when present, conveniently can be added to the water during the wet grinding process. Upon drying, these additives remain associated with the dried powder.

Typically, a force in the range of about 5 to about 20 tons is applied to a quantity of powder in a die or mold for a time period in the range of about 10 to about 15 seconds to form the green body, utilizing, for example, a hydraulic press.

Preferably, the binder is present in the green body in an amount in the range of about 1 to about 1.5 percent by weight, based on the weight of the green body. Preferred binders include one or more compounds selected from PVA, carboxymethyl cellulose, starch, gelatine, a water soluble acrylic resin, and the like. Most preferably the binder is PVA. Binders suitable for use in ceramic processing are well known in the art and include, for example, DURAMAX® brand binders available from Rohm and Haas Company, Philadelphia, Pa.

The green body also preferably includes one or more plasticizers, such as a polyethylene glycol (e.g., a polyethylene glycol having a molecular weight in the range of about 200 to about 20,000, preferably in the range of about 200 to about 1500), in an amount in the range of about 1 to about 2% by weight, based on the weight of the green body, more preferably in the range of about 1.4 to about 1.8 percent by weight, most preferably about 1.6 percent by weight. Preferably the plasticizer is polyethylene glycol having a weight average molecular weight of about 200 (PEG-200).

Surfactants and dispersants, preferably non-ionic or ammonium salts of anionic surfactants and dispersants, can be added to aid in the grinding of the metal oxide powder mixture prior to calcining, or the calcined powder prior to sintering. A lubricant, such as stearic acid, can also be added to the green body, as is known in the art.

After discharge from the die or mold, the green body is sintered to reduce the void space between the particles and form a strong, solid, ceramic material. Preferably, the green body is sintered at a temperature in the range of about 1300 to about 1500 EC, taking care to remain at a temperature below the melting point of the mixture. More preferably, the green body is sintered at a temperature in the range of about 1300 to about 1400 EC, most preferably about 1370 EC, by heating the green body in a furnace under an oxidizing atmosphere, preferably an air atmosphere.

Preferably, the green body is placed in a cold furnace and the temperature is raised at a rate in the range of about 2 to about 10 EC per minute until a burn-off temperature of at least about 500 EC, preferably in the range of about 500 to about 600 EC, is obtained. The green body preferably is held at the burn-off temperature for a time period in the range of about 1 to about 2 hours to burn off organic materials in the green body such as binders, plasticizers, dispersants, lubricants, and the like. The temperature is then increased at a rate in the range of about 2 to about 10 EC per minute and the material is held at a sintering temperature in the range of about 1300 to about 1500 EC, preferably in the range of about 1350 to about 1400, most preferably about 1370 EC, for a time period in the range of about 2 to about 6 hours. More preferably, the material is held at the sintering temperature for a time period in the range of about 3 to about 5 hours, most preferably about 4 hours.

The ceramic materials of the present invention are particularly useful as microwave band filters in telecommunications equipment in WCDMA and PCS applications. Examples of such equipment include digital wireless phones, pagers, antennas, capacitors, varistors, resistors, multi-layer co-fire ceramic (MLCC) devices, and the like.

A dielectric resonator of the present invention comprises a ceramic material of the present invention electromagnetically coupled to an input-output terminal. The resonator typically comprises a rectangular prism-shaped block of ceramic material, which generally defines one or more cylindrical cavities therethrough. The dielectric resonator preferably includes a layer of conductive metal such as copper or silver, in electrical contact with at least one surface of the dielectric resonator. A dielectric microwave filter can be prepared from the resonator by combining the filter with an external coupler, as is well known in the art.

As shown in FIG. 1, dielectric microwave filter 1 comprises a rectangular prism-shaped ceramic block 10 defining two cylindrical cavities 12 and 13. Block 10 is composed of a ceramic material of the present invention. Four sides of block 10 are substantially covered with a conductive metal coating 14, as are the interiors of cavities 12 and 13. Input-output terminals 16 and 17 are formed in metal coating 14. Terminals 16 and 17 are patches of conductive metal, which are insulated from metal coating 14 by ceramic block 10. Terminals 16 and 17 can be formed, for example, by masking a portion of the ceramic block 10 prior to covering the sides with metal coating 14.

Dielectric duplexers of the present invention for use in microwave telecommunication devices comprise at least two dielectric microwave filters connected in series relationship to one another through an input-output terminal on each filter, and an antenna connector operably connected to each of the dielectric microwave filters in common. Each filter also has a free input-output terminal. In a preferred embodiment, a duplexer comprises a single ceramic block having the two microwave filters integral to one another. In this integral duplexer embodiment, the duplexer includes at least two free input-output terminals and one antenna connector. The dielectric duplexers are useful in digital telecommunication devices.

Figure 2:
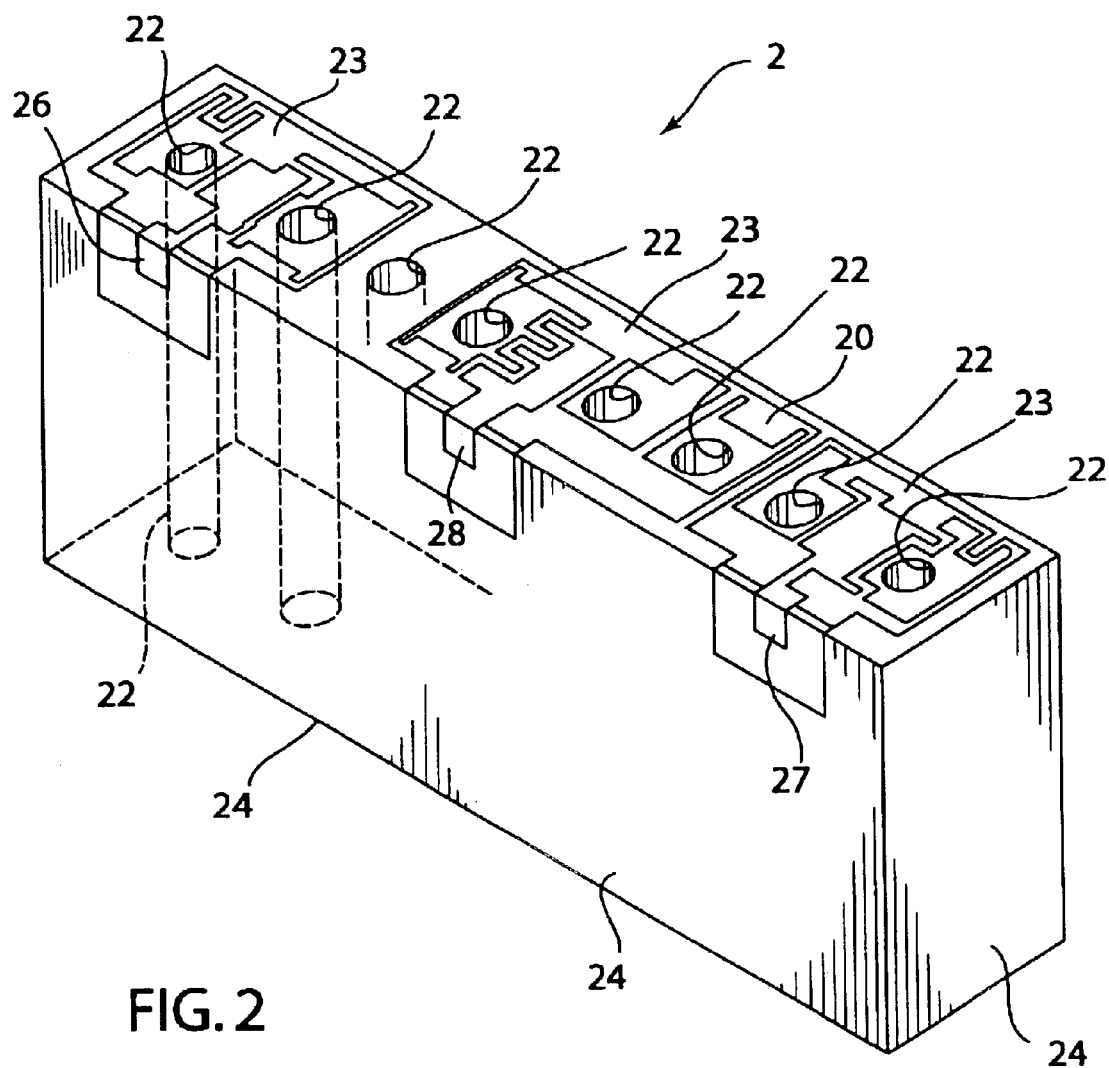
FIG. 2 illustrates a dielectric duplexer of the present invention.

As shown in FIG. 2, integral duplexer 2 includes a rectangular prism-shaped ceramic block 20 defining through-holes 22. Four sides of block 20 are substantially covered with a conductive metal coating 24, as are the side walls of through-holes 22. Input-output terminals 26 and 27 are formed in metal coating 24. Terminals 26 and 27 are metallized areas on the surface of block 20, which are insulated from metal coating 24 by unmetallized areas 23. An antenna connector metallized area 28 is positioned in the central portion of block 20.

The following examples are provided to further illustrate the principles of the invention and are not intended to limit the invention to the preferred embodiments disclosed herein. Raw Materials, Processing Methods, and Analytical Methods.

Barium carbonate (about 99.9% purity) was obtained from Solvay Performance Chemicals unit of Solvay Minerals, Inc., Houston, Tex., neodymium oxide (about 96% purity) was obtained from Rhodia Electronics and Catalysis, La Rochelle, France, samarium oxide (about 99% purity) was obtained from Rhodia Electronics and Catalysis, La Rochelle, France, bismuth oxide (about 99.9% purity) was obtained from Metal Specialties, Inc, Fairfield, Conn., and titanium dioxide (about 99.9% purity) was obtained from Ishihara Sangyo Kaisha, Ltd., Osaka, Japan. TAMOL® 963 is a dispersant which, according to its manufacturer is a 40% solution of a sodium salt of a polymeric carboxylic acid, available from Rohm & Haas, Co., Philadelphia, Pa.

The resonant frequency, dielectric constant (K) and the quality factor, Q, of each ceramic material was measured by the well-known Hakki-Coleman method, as described, for example, by Hakki and Coleman, "A Dielectric Method of Measuring Inductive Capacities in the Millimeter Range" *IRE Transactions on Microwave Theory and Techniques*, July, 1960, pp. 402–409. The resonant frequency used for the measurements fell in the range of about 2000 MHz to about 2300 MHz. The $T_f$ of each material was measured directly at temperatures between about −40 EC to about +85 EC using Hakki-Coleman parallel plates in a Sun System oven with calculations performed by LabView computer software. The frequency*quality factor, $Q_f$, was calculated by multiplying the Q value by the resonant frequency (in GHz).

EXAMPLE 1

Preparation of a Calcined Powder of the Present Invention

Preparation of the Metal Oxide Mixture. Two production sized batches of a mixture containing barium carbonate (about 26.3 Kg), neodymium oxide (about 8 Kg), samarium oxide (about 18.7 Kg), bismuth oxide (about 1.9 Kg), titanium dioxide (about 45.2 Kg), TAMOL® 963 dispersant (about 1 Kg) and water (about 38 Kg) were separately placed in a 208 Gallon Ball Mill from Paul O'Abbe, NJ, containing magnesium oxide-stabilized zirconium oxide grinding medium, about 1300 kgs (about 0.5 by 0.5 inch cylinder-shaped). The mixtures were each ground for about 3600 revolutions of the mill. Each batch was removed from the mill and separated from the grinding medium, the water was decanted and the batches were combined and dried in a Despatch forced-air convection oven at a temperature of about 125 EC for about 18 hours. The combined, dried batches were passed through a 40–60 mesh sieve.

Calcining. The sieved powder was placed in a Harrop continuous pusher plate furnace and the temperature was raised at a rate of about 2 to about 10 EC up to a set point of about 1150 EC in an air atmosphere. The powder was calcined at the set point temperature for about 4 hours and then brought back down to room temperature at a rate of about 2 to about 10 EC. The calcined material was then discharged from the furnace and placed in a 208 Gallon Ball Mill from Paul O'Abbe, NJ, with about 42 weight % water, about 900 kgs of alumina medium (about 0.5 by 0.5 inch cylinder-shaped), about 1.6 weight % PEG, and about 1.0 weight % PVA. The resulting mixture was ground in the ball mill for about 3600 revolutions of the mill. The ground calcined powder was then discharged from the mill and separated from the grinding medium, and the material was spray dried in a 30 foot high Niro, Md., spray drier at a temperature of about 125 EC, to afford a dry, calcined powder of the present invention. 0.0015 weight % magnesium stearate lubricant was added to the powder following spray dry.

EXAMPLE 2

Preparation of Ceramic Material A of the Present Invention

A green body was formed from the calcined powder of Example 1 by placing 39 grams of the powder in a stainless steel cylindrically-shaped die having a diameter of about 1.33 inches, placing a cylindrical plunger, sized to fit within the cylindrical cavity of the die, into the upper open end of the die over the powder, and applying a force of about 15 to about 20 tons to the plunger in a hydraulic press to compress the powder into a green body. The pressure was applied for about 10 seconds. The green body was discharged from the die cavity and had a cylindrical shape, with a diameter of about 1.33 inches and a height of about 0.5 inches. The green body had a density of 3.00 grams per cubic centimeter ($g/cm^3$). A number of substantially identical green bodies were made in this way.

The green bodies were then placed in a Harrop continuous pusher plate furnace and the temperature was raised at a rate of about 2 to about 10 EC up to a set point of about 600 EC, and held at this temperature for about 1 hour to substantially burn off the organic binder (PVA), the plasticizer (PEG-200), and the stearic acid lubricant. The temperature was then increased at a rate of about 2 to about 10 EC up to a sintering temperature of about 1370 EC and held at this temperature for about 4 hours. The sintering was accomplished in an air atmosphere. The resultant was the ceramic material (Ceramic Composition A).

The electromagnetic properties of the ceramic material were tested as described above, and the results were as follows: K was about 62, Q was about 4539, $Q_f$ was about 9577, f was about 2110, $T_f$ was about +5.3, and the fired density (FD) was about 5.18.

Upon analysis by inductively-coupled plasma (ICP) spectrometry, the produced material had the following compositions: 21.47 wt % $BaCO_3$, 49.94 wt % $TiO_2$, 18.91 wt % $Sm_2O_3$, 8.70 wt % $Nd_2O_3$ and 1.87 wt % $Bi_2O_3$. This molecular composition translates to the following element composition: 29.94 wt % titanium, 19.23 wt % barium, 16.31 wt % samarium, 7.46 wt % neodymium and 1.68 wt % bismuth.

EXAMPLE 3

Ceramic Compositions B through K

Ceramic Compositions B–K of the present invention were prepared according to the method described for the preparation of Composition A, above. The relative amounts of the raw materials used in each preparation are provided in Table 1. The elemental compositions of each ceramic material are provided in Table 2. The measured values for F, Q, $Q_f$, $T_f$, K, and the density after sintering (fired density, FD, in grams per cubic centimeter, g/cc) are provided in Table 3. Significantly different processing parameters used in the preparation of any of the materials are noted in footnotes after Table 1. Materials designated CC1 and CC2 are comparative ceramic materials that do not contain samarium, which were also prepared by the method used for the preparation of Composition A, but substituting the indicated amounts of raw materials.

TABLE 1

Metal Oxide Mixture Compositions (parts by weight)

| Composition | $BaCO_3$ | $Nd_2O_3$ | $Sm_2O_3$ | $Bi_2O_3$ | $TiO_2$ |
|---|---|---|---|---|---|
| CC1 | 27.4 | 24.3 | 0 | 1.5 | 46.9 |
| CC2 | 26.3 | 26.7 | 0 | 1.9 | 45.1 |
| A | 26.3 | 8 | 18.7 | 1.9 | 45.2 |
| B | 27.4 | 12.1 | 12.1 | 1.5 | 46.9 |
| C | 26.3 | 13.3 | 13.3 | 1.9 | 45.1 |
| D | 27.4 | 8.5 | 15.8 | 1.5 | 46.9 |
| E | 27.8 | 8.6 | 16 | 0 | 47.6 |
| F | 26.8 | 9.5 | 17.7 | 0 | 46.1 |
| G | 26.3 | 9.3 | 17.3 | 1.9 | 45.1 |
| H | 26.2 | 9.3 | 17.2 | 2.4 | 44.9 |
| I | 26 | 9.2 | 17.1 | 3.1 | 44.5 |
| J | 26.2 | 8 | 18.6 | 2.4 | 44.9 |
| K | 26 | 7.9 | 18.5 | 3.1 | 44.5 |

TABLE 2

Elemental Compositions of Ceramic Materials

| Composition | Wt % Ba | Wt % Nd | Wt % Sm | Wt % Bi | Wt % Ti |
|---|---|---|---|---|---|
| CC1 | 20.3 | 22.1 | 0 | 1.4 | 29.9 |
| CC2 | 19.5 | 24.3 | 0 | 1.8 | 28.7 |
| A | 19.4 | 7.3 | 17.1 | 1.8 | 28.8 |
| B | 20.3 | 11.1 | 11.1 | 1.4 | 29.9 |
| C | 19.5 | 12.1 | 12.2 | 1.8 | 28.7 |
| D | 20.3 | 7.8 | 14.5 | 1.4 | 29.9 |
| E | 19.5 | 7.9 | 14.7 | 0 | 30.4 |
| F | 20.3 | 8.7 | 16.2 | 0 | 29.3 |
| G | 20.6 | 8.5 | 15.9 | 1.8 | 28.7 |
| H | 19.8 | 8.5 | 15.8 | 2.3 | 28.6 |
| I | 19.5 | 8.4 | 15.7 | 3 | 28.3 |
| J | 19.4 | 7.2 | 17 | 2.3 | 28.6 |
| K | 19.2 | 7.2 | 16.9 | 3 | 28.3 |

TABLE 3

Properties of Ceramic Materials

| Comp. | K | Q | $Q_f$ (GHz) | f (MHz) | $T_f$ (ppm) | FD (g/cc) |
|---|---|---|---|---|---|---|
| CC1 | 63 | 4184 | 9330 | 2230 | 42.9 | 5.10 |
| CC2 | 68 | 4623 | 9329 | 2018 | 41.4 | 5.21 |
| A | 62 | 4539 | 9577 | 2110 | 5.3 | 5.18 |
| B | 61 | 4436 | 10025 | 2260 | 16.2 | 5.13 |
| C | 63 | 4744 | 10532 | 2220 | 14.1 | 5.20 |
| D | 59 | 4369 | 9743 | 2230 | 5.9 | 5.10 |
| E | 59 | 5180 | 11914 | 2300 | 12.9 | 5.12 |
| F | 61 | 5143 | 11623 | 2260 | 16.4 | 5.17 |
| G | 64 | 4766 | 9827 | 2062 | 12.2 | 5.19 |
| H | 62 | 4580 | 9664 | 2110 | 6.9 | 5.16 |
| I | 64 | 4492 | 9298 | 2070 | 6.2 | 5.20 |
| J | 63 | 4489 | 10109 | 2252 | 5.3 | 5.22 |
| K | 64 | 4143 | 9276 | 2239 | 3.4 | 5.19 |

As the data in Table 3 indicate, the ceramic Compositions A–K of the present invention have $T_f$ values of not more than 16.4 ppm, K values in the range of about 59 to about 64, f in the range of about 2000 to about 2300 MHz, and Q values in the range of about 4000 to about 5200. Compositions D and G–K, containing bismuth in the range of about 1 to about 3 weight %, and containing about 14 to about 17 weight % samarium and about 7 to about 9 weight % neodymium, on an elemental composition weight basis, had $T_f$ values of not more than about 12 ppm, with Compositions D and H–K having $T_f$ values in the range of about 3.4 to about 6.9. In contrast, comparative ceramic materials CC1 and CC2, which did not include samarium oxide, had unacceptably high $T_f$ values of greater than 40 ppm.

We claim:

1. A ceramic material consisting essentially of, on an elemental weight basis:
   about 28 to about 31 weight % titanium;
   about 19 to about 21 weight % barium;
   about 11 to about 18 weight % samarium;
   about 7 to about 13 weight % neodymium; and
   up to about 3 weight % of bismuth;
   the titanium, barium, samarium, neodymium, and bismuth being present in the ceramic material in the form of oxides; the neodymium and samarium being present in the composition in an elemental weight ratio of Nd:Sm in the range of about 1:1 to about 1:2.5.

2. A ceramic material in accordance with claim 1 having a dielectric constant, K, in the range of about 50 to about 70.

3. A ceramic material in accordance with claim 1 having a quality factor, Q, of at least about 4000.

4. A ceramic material in accordance with claim 1 having a temperature coefficient of resonant frequency, $T_f$, in the range of about 0 ppm to about +20 ppm.

5. A ceramic material in accordance with claim 1 having a fired density in the range of about 5 to about 5.3 grams per cubic centimeter.

6. A ceramic material in accordance with claim 1 wherein the ceramic material has a bismuth content of at least about 1 weight % bismuth on an elemental weight basis.

7. A ceramic material in accordance with claim 1 wherein the ceramic material has a samarium content of at least about 14 weight % samarium on an elemental weight basis.

8. A ceramic material in accordance with claim 1 wherein the ceramic material has a neodymium content of not more than about 9 weight % neodymium on an elemental weight basis.

9. A ceramic material consisting essentially of, on an elemental weight basis:
   about 28 to about 31 weight % titanium;
   about 19 to about 21 weight % barium;
   about 14 to about 18 weight % samarium;
   about 7 to about 9 weight % neodymium; and
   about 1 to about 3 weight % bismuth;
   the titanium, barium, samarium, neodymium, and bismuth being present in the ceramic material in the form of oxides; the neodymium and samarium being present in the composition in an elemental weight ratio of Nd:Sm in the range of about 1:1 to about 1:2.5.

10. A ceramic material in accordance with claim 9 having a dielectric constant, K, in the range of about 50 to about 70.

11. A ceramic material in accordance with claim 9 having a quality factor, Q, of at least about 4000.

12. A ceramic material in accordance with claim 9 having a temperature coefficient of resonant frequency $T_f$ in the range of about 0 ppm to about +12 ppm.

13. A calcined powder suitable for preparation of a ceramic material, the powder consisting essentially of, on an elemental weight basis:
   about 28 to about 31 weight % titanium;
   about 19 to about 21 weight % barium;
   about 11 to about 18 weight % samarium;
   about 7 to about 13 weight % neodymium; and
   up to about 3 weight % of bismuth;
   the titanium, barium, samarium, neodymium, and bismuth being present in the calcined powder in the form of oxides; the neodymium and samarium being present in the composition in an elemental weight ratio of Nd:Sm in the range of about 1:1 to about 1:2.5.

14. A calcined powder in accordance with claim 13 wherein the powder has a bismuth content of at least about 1 weight % bismuth on an elemental weight basis.

15. A calcined powder in accordance with claim 13 wherein the powder has a samarium content of at least about 14 weight % samarium on an elemental weight basis.

16. A calcined powder in accordance with claim 13 wherein the powder has a neodymium content of not more than about 9 weight % neodymium on an elemental weight basis.

17. A method of manufacturing the ceramic material of claim 1 having a temperature coefficient of resonant frequency, $T_f$, in the range of about 0 ppm to about +20 ppm, a resonant frequency in the range of about 2000 to about 2300 MHz, a Q value of at least about 4000, and a dielectric constant, K, in the range of about 50 to about 70, the method comprising the steps of:
   calcining a finely divided, substantially homogeneous metal oxide mixture consisting essentially of, on a total mixture weight basis, about 26 to about 28 weight % $BaCO_3$, about 47 to about 50 weight % $TiO_2$, about 12 to about 20 weight % $Sm_2O_3$, about 7.5 to about 14 weight % $Nd_2O_3$, and up to about 3.2 weight % $Bi_2O_3$, the calcining being effected at a temperature in the range of about 1000 to about 1250 C for a time period in the range of about 2 to about 6 hours, and comminuting the resultant calcined mixture, if necessary, so that the calcined mixture has a mean particle size of not more than about 40 mesh;
   forming a green body from the calcined mixture;
   sintering the green body at a temperature in the range of about 1300 to about 1500 C, for a time period in the range of about 3 to about 5 hours to form a ceramic material; and
   cooling the resultant ceramic material.

18. The method of claim 17 wherein the $Bi_2O_3$ is present in an amount of at least about 1 weight %, based on the total weight of the metal oxide mixture prior to calcining.

19. The method of claim 17 wherein the $Sm_2O_3$ is present in an amount of at least about 15 weight %, based on the total weight of the metal oxide mixture prior to calcining.

20. The method of claim 17 wherein the $Nd_2O_3$ is present in an amount of not more than about 10 weight %, based on the total weight of the metal oxide mixture prior to calcining.

21. The method of claim 17 wherein the mixture includes about 15 to about 20 weight % $Sm_2O_3$, about 8 to about 10 weight % $Nd_2O_3$, and about 1 to about 3.2 weight % $Bi_2O_3$ based on the total weight of the metal oxide mixture prior to calcining.

22. A ceramic material produced in accordance with the method of claim 17.

23. A dielectric resonator comprising a block of ceramic material of claim 1 and a layer of conductive metal in electrical contact with a surface of the block.

24. A dielectric resonator in accordance with claim 23 wherein the conductive metal is copper or silver.

25. A dielectric microwave filter comprising a dielectric resonator of claim 23 further including at least two input-output terminals.

* * * * *